United States Patent
Baba

(10) Patent No.: US 6,888,389 B2
(45) Date of Patent: May 3, 2005

(54) DIGITAL CONTROL VARIABLE DELAY CIRCUIT WHICH IS HARDLY SUSCEPTIBLE TO NOISE

(75) Inventor: Mitsuo Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 27 days.

(21) Appl. No.: 10/659,364

(22) Filed: Sep. 11, 2003

(65) Prior Publication Data

US 2005/0017780 A1 Jan. 27, 2005

(30) Foreign Application Priority Data

Sep. 12, 2002 (JP) .................................. 2002/266552
Nov. 7, 2002 (JP) .................................. 2002/323821

(51) Int. Cl.[7] .............................................. H03H 11/26
(52) U.S. Cl. ...................... 327/261; 327/269; 327/274; 327/276; 327/280
(58) Field of Search .................................. 327/261, 269, 327/274, 276, 280

(56) References Cited

U.S. PATENT DOCUMENTS 5,554,945 A 9/1996 Lee et al.
5,734,284 A * 3/1998 Popescu ...................... 327/283

FOREIGN PATENT DOCUMENTS

| JP | 63-31214 A | 2/1988 |
|---|---|---|
| JP | 6-152343 A | 5/1994 |
| JP | 9-214334 A | 8/1997 |
| JP | 9-512965 A | 12/1997 |
| JP | 11-284497 A | 10/1999 |

* cited by examiner

Primary Examiner—Timothy P. Callahan
Assistant Examiner—An T. Luu
(74) Attorney, Agent, or Firm—Sughrue Mion, PLLC

(57) ABSTRACT

A digital control variable delay circuit includes n amplitude control units which are connected in parallel and each of which receives a pair of input clock signals to be supplied to a differential pair and receives m-bit digital control signals, and a waveform shaping unit which is connected to the outputs of the n amplitude control units. Each amplitude control unit is capable of varying the amplitude of each of the pair of clock signals into (m+1) values using the m-bit digital control signals, and outputs a pair of amplitude-varied clock signals. The waveform shaping unit receives a pair of added clock signals obtained by adding and combining the pairs of amplitude-varied clock signals outputted from the n amplitude control units and outputs a pair of resultant clock signals as output signals.

8 Claims, 9 Drawing Sheets

|  | STATE A | STATE B | STATE C | STATE D |
|---|---|---|---|---|
| SW1-1 | on | off | off | on ⎫ 2 |
| SW1-2 | on | on | off | on ⎭ SIGNALS |
| SW1-3 | on | on | on | off |
| ⋮ | ⋮ m SIGNALS | ⋮ (m-1) SIGNALS | ⋮ (m-2) SIGNALS | ⋮ |
| SW1-(m-1) | on | on | on | off |
| SW1-m | on | on | on | off |
| SW2-1 | off | on } 1 SIGNAL | on ⎫ 2 SIGNALS | off |
| SW2-2 | off | off | on ⎭ | off |
| SW2-3 | off | off | off | off |
| ⋮ | ⋮ | ⋮ | ⋮ | ⋮ |
| SW2-(m-1) | off | off | off | off |
| SW2-m | off | off | off | off |
|  | off | off | off | off |
| ⋮ | ⋮ | ⋮ | ⋮ | ⋮ |
|  | off | off | off | off |
| SWn-1 | off | off | off | off |
| SWn-2 | off | off | off | off |
| SWn-3 | off | off | off | on |
| ⋮ | ⋮ | ⋮ | ⋮ | ⋮ (m-2) SIGNALS |
| SWn-(m-1) | off | off | off | on |
| SWn-m | off | off | off | on |

(n × m DIGITAL CONTROL SIGNAL)

FIG. 3

|  | | STATE1 | STATE2 | STATE3 | STATE4 | STATE5 |
|---|---|---|---|---|---|---|
| 4×4 DIGITAL CONTROL SIGNAL | SW1-1 | on ⎫ | off | off | off | off |
| | SW1-2 | on ⎪ 4 | on ⎫ | off | off | off |
| | SW1-3 | on ⎬ SIGNALS | on ⎬ 3 SIGNALS | on ⎫ 2 | off | off |
| | SW1-4 | on ⎭ | on ⎭ | on ⎬ SIGNALS | on ⎬ 1 SIGNAL | off |
| | SW2-1 | off | on ⎬ 1 SIGNAL | on ⎫ 2 | on ⎫ | on ⎫ |
| | SW2-2 | off | off | on ⎬ SIGNALS | on ⎬ 3 SIGNALS | on ⎪ 4 |
| | SW2-3 | off | off | off | on ⎭ | on ⎬ SIGN. |
| | SW2-4 | off | off | off | off | on ⎭ |
| | SW3-1 | off | off | off | off | off |
| | SW3-2 | off | off | off | off | off |
| | SW3-3 | off | off | off | off | off |
| | SW3-4 | off | off | off | off | off |
| | SW4-1 | off | off | off | off | off |
| | SW4-2 | off | off | off | off | off |
| | SW4-3 | off | off | off | off | off |
| | SW4-4 | off | off | off | off | off |

FIG. 6

|  | STATE 1 | STATE 2 | STATE 3 |
|---|---|---|---|
| SW1-1 | on | off | off |
| SW1-2 | on | on | off |
| SW1-3 | on | on | on |
| SW1-4 | on | on | on |
| SW2-1 | off | on | on |
| SW2-2 | off | off | on |
| SW2-3 | off | off | off |
| SW2-4 | off | off | off |
| SW3-1 | off | off | off |
| SW3-2 | off | off | off |
| SW3-3 | off | off | off |
| SW3-4 | off | off | off |
| SW4-1 | off | off | off |
| SW4-2 | off | off | off |
| SW4-3 | off | off | off |
| SW4-4 | off | off | off |

4 SIGNALS ARE ON (m NUMBER OF SIGNALS) ↔ 4 SIGNALS ARE ON (m NUMBER OF SIGNALS) ↔ 4 SIGNALS ARE ON (m NUMBER OF SIGNALS)

5 SIGNALS ARE ON (m+1 NUMBER OF SIGNALS)     5 SIGNALS ARE ON (m+1 NUMBER OF SIGNALS)

FIG. 8

DIGITAL CONTROL VARIABLE DELAY CIRCUIT WHICH IS HARDLY SUSCEPTIBLE TO NOISE

BACKGROUND OF THE INVENTION

1. Field of the Invention

The present invention relates to digital control variable delay circuits and more particularly to a digital control variable delay circuit for receiving n pairs of phase-shifted clock signals as input signals and varying the amplitudes of the input signals in response to digital control signals supplied separately to generate signals each having the varied amplitude as output signals.

2. Description of the Related Art

A voltage-controlled phase shifter having an unlimited range is included in latest techniques which can be applied to variable delay circuits. For example, PCT Japanese Translation Patent Publication No. 9-512965 discloses such a voltage-controlled phase shifter. The voltage-controlled phase shifter selects two adjacent signals from among a plurality of multiphase signals and outputs phase-shifted signals by carrying out weighting and adding to the selected signals in accordance with an analog control voltage by the use of an interpolator.

Techniques related to the other variable delay circuits are disclosed in, for example, Japanese Unexamined Patent Publication Nos. 63-31214 and 6-152343. In addition Japanese Unexamined Patent Publication No. 9-214334 discloses a digital delay interpolator. Further, Japanese Unexamined Patent Publication No. 11-284497 discloses a programmable delay generator.

The above-mentioned voltage-controlled phase shifter determines the amount of phase shift in accordance with an analog control voltage. Therefore, the voltage-controlled phase shifter is susceptible to external noise. For example, in an environment where an external factor such as power source noise considerably affects on the shifter, the analog control voltage varies due to the noise, resulting in a fluctuation of the phase of a phase-shifted output signal. In addition, it is necessary to control a phase selector for selecting two signals and a phase interpolator for weighting and interpolating the two signals. Consequently, the above-mentioned voltage-controlled phase shifter has complicated circuitry. In addition, disadvantageously, the relation between the analog control voltage and the amount of phase shift is not uniquely determined due to a manufacturing variation in circuit elements or fluctuations in supply voltage and ambient temperature.

For this reasons, the above-mentioned voltage-controlled phase shifter is hard to apply to a variable delay circuit under present circumstances.

SUMMARY OF THE INVENTION

Accordingly, it is an object of the present invention to provide a digital control variable delay circuit with simple circuitry which is hardly susceptible to influences caused by external noise and which delays a signal by the amount of delay uniquely corresponding to a control signal to ensure arbitrary infinite delay of one period or longer.

According to the present invention, the digital control variable delay circuit includes n amplitude control units which are connected in parallel and each of which receives a pair of input clock signals to be supplied to a differential pair and receives m-bit digital control signals, n and m each indicating a natural number of 2 or larger, and a waveform shaping unit which is shared between the n amplitude control units and is connected, in common, to the outputs of the n amplitude control units. The respective pairs of clock signals supplied to the n amplitude control units are shifted in phase by about 1/n period. Each amplitude control unit is capable of varying the amplitude of each of the pair of clock signals into (m+1) values using the m-bit digital control signals, and outputs a pair of amplitude-varied clock signals. The waveform shaping unit receives a pair of added clock signals obtained by adding and combining the pairs of amplitude-varied clock signals outputted from the n amplitude control units. The waveform shaping unit shapes the waveform of each of the pair of added clock signals and then outputs a pair of resultant clock signals as output signals.

Preferably, each amplitude control unit includes a pair of MOS transistors sharing a common terminal and constituting a differential pair, m current source circuits connected in parallel, and a pair of load resistors connected to respective output terminals of the pair of MOS transistors. The m current source circuits each include a current source and a switch. Each current source and the corresponding switch are connected in series. Each switch is turned on or off by the corresponding one of the m-bit digital control signals. One end of each of the m current source circuits connected in parallel is connected to ground and the other end thereof is connected to the common terminal of the pair of MOS transistors. The output terminals of the pair of MOS transistors output the pair of amplitude-varied clock signals.

BRIEF DESCRIPTION OF THE DRAWINGS

FIG. 3 is a schematic diagram of the transition of the states of (n×m) digital control signals supplied to the amplitude control unit shown in FIG. 2;

FIG. 6 is a schematic diagram of the transition of (4×4) digital control signals supplied to the amplitude control units provided for the digital control variable delay circuit of FIG. 4;

FIG. 8 is a signal waveform diagram of (4×4) digital control signals to prevent a reduction in current in the digital control variable delay circuit of FIG. 4, the waveforms changing with the transition of the states of the digital control signals.

DESCRIPTION OF THE PREFERRED EMBODIMENTS

Figure 1:
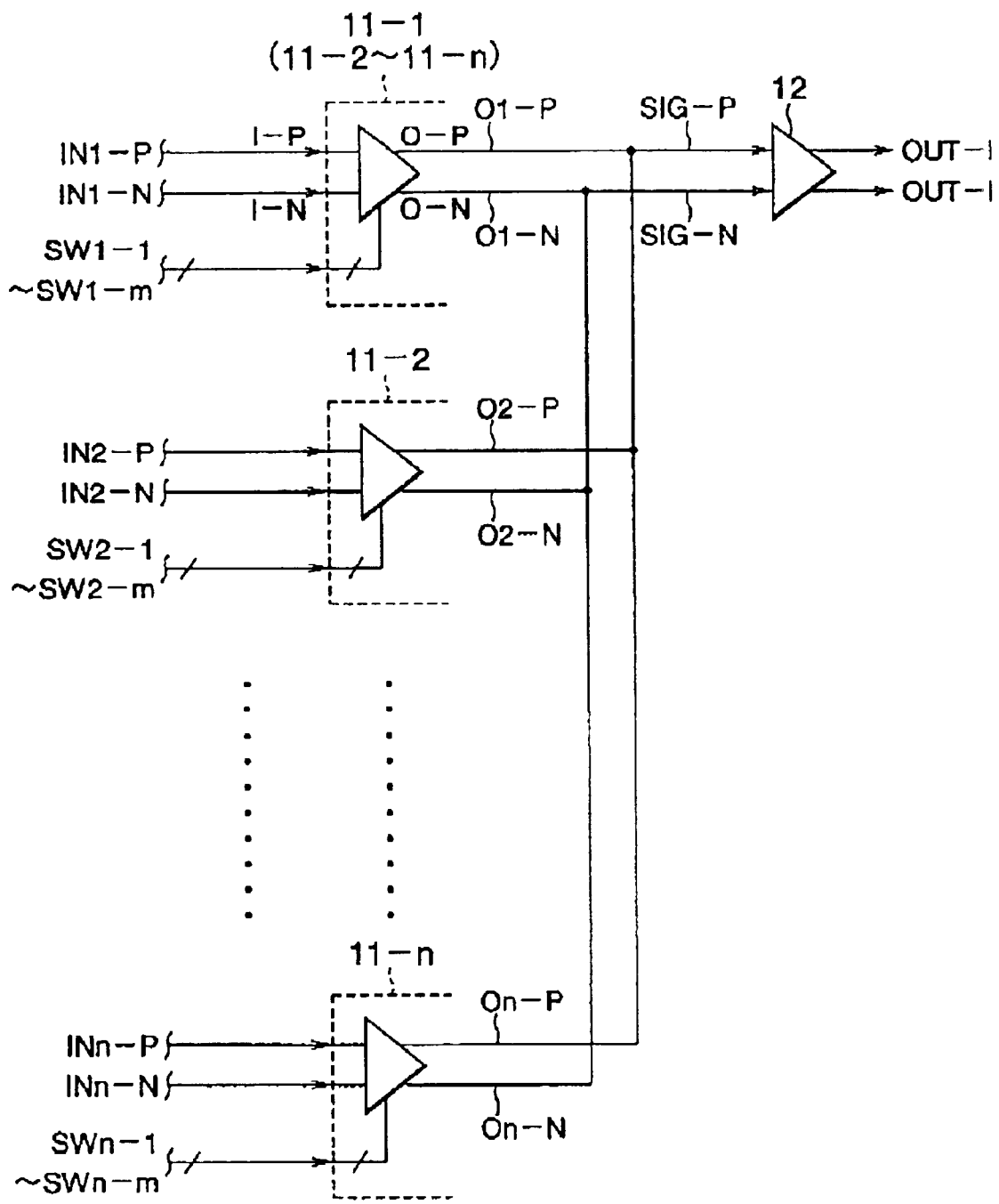
FIG. 1 is a circuit diagram of the configuration of a digital control variable delay circuit according to an embodiment of the present invention.

FIG. 1 is a circuit diagram of the configuration of a digital control variable delay circuit according to an embodiment of the present invention. The digital control variable delay circuit comprises n amplitude control units 11-1 to 11-n connected in parallel and a waveform shaping unit 12. Each amplitude control unit comprises a pair of transistors constituting a differential pair as will be described later. The digital control variable delay circuit receives n pairs of clock signals IN1-P and IN1-N, IN2-P and IN2-N, ..., and INn-P and INn-N which are shifted in phase by about 1/n period. The digital control variable delay circuit also receives (n×m) digital control signals SW1-1 to SW1-m, SW2-1 to SW2-m, ..., and SWn-1 to SWn-m as digital control signals for varying amplitude. In other words, each of the n amplitude control units receives the m-bit digital control signals. The digital control variable delay circuit is capable of varying the amplitude of each input clock signal into (m+1) values on the basis of the digital control signals. Each of n and m denotes a natural number of 2 or larger.

The amplitude control unit 11-1 will now be described. The amplitude control unit 11-1 receives the pair of clock signals IN1-P and IN1-N as input signals, varies the amplitude of each of the input clock signals on the basis of the m-bit digital control signals SW1-1 to SW1-m, and generates the resultant clock signals as a pair of amplitude-varied clock signals O1-P and O1-N. The amplitude control units 11-2 to 11-n operate in a manner similar to the amplitude control unit 11-1. The pair of clock signals IN1-P and IN1-N are input to the pair of transistors constituting the differential pair. Accordingly, the clock signals IN1-P and IN1-N have the same amplitude. Needless to say, the clock signals are shifted 180 degrees in phase. The same applies to the other pairs of clock signals.

The n pairs of amplitude-varied clock signals generated from the n amplitude control units 11-1 to 11-n are added and combined to form a pair of added clock signals SIG-P and SIG-N. The pair of added clock signals are output to the waveform shaping unit 12. The waveform shaping unit 12 shapes the waveforms of each of the pair of added clock signals SIG-P and SIG-N and then outputs the pair of resultant clock signals as output clock signals OUT-P and OUT-N.

In FIG. 1, input terminals I-P and I-N and output terminals O-P and O-N are shown only in the amplitude control unit 11-1.

As will be described later, in the n amplitude control units 11-1 to 11-n, when all of the input digital control signals SW1-1 to SWn-m are turned off, the amplitude of each of the pair of added clock signals SIG-P and SIG-N denotes zero. On the other hand, when one or more of the input digital control signals SW1-1 to SWn-m are turned on, the amplitude of each of the pair of added clock signals SIG-P and SIG-N lies in a range of (the maximum value×1/m) to (maximum value×m/m). In other words, when all of the digital control signals SW1-1 to SWn-m are turned on, each of the pair of added clock signals SIG-P and SIG-N has the maximum amplitude.

Figure 2:
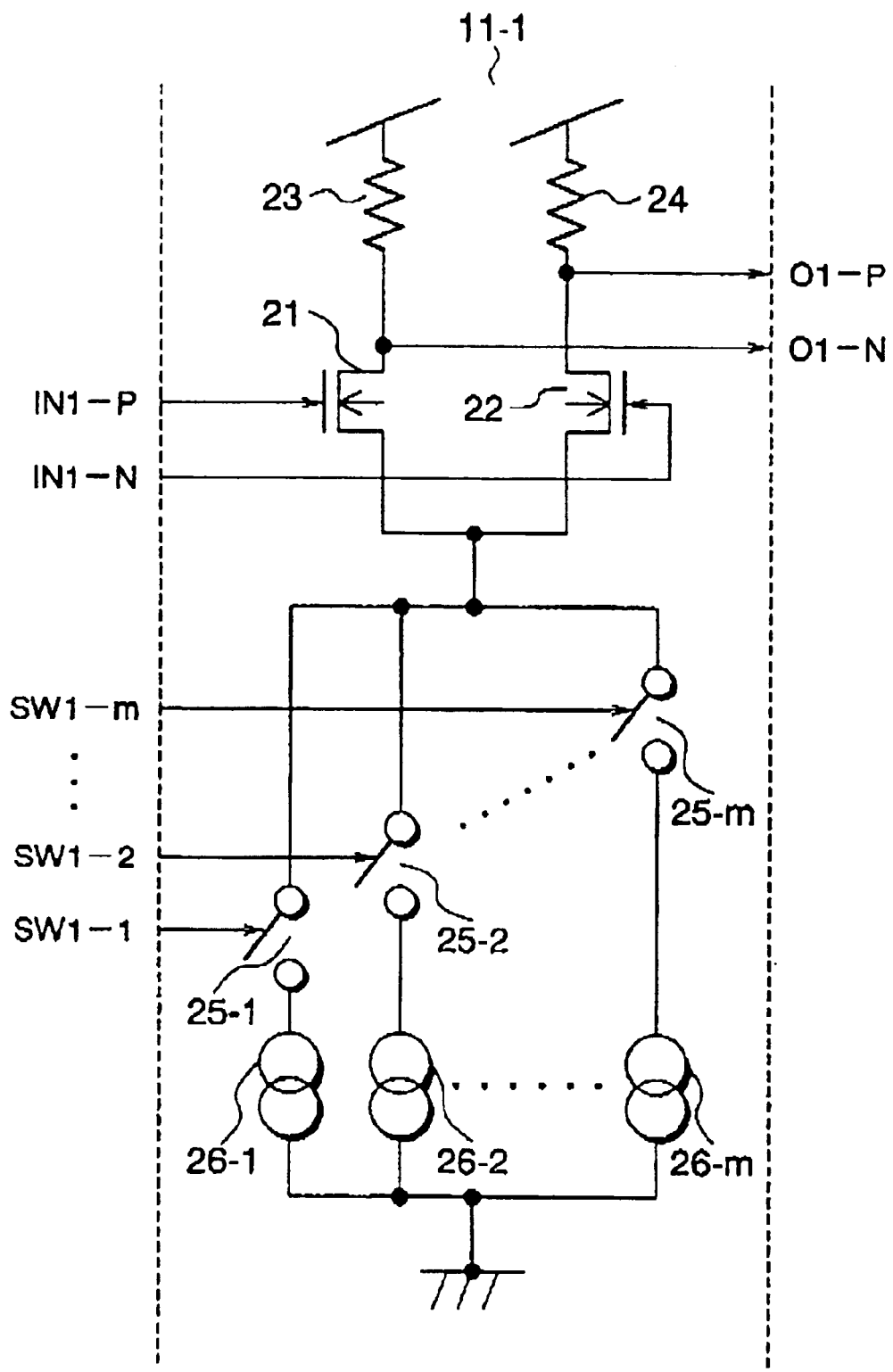
FIG. 2 is a circuit diagram of the internal structure of each amplitude control unit provided for the digital control variable delay circuit shown in FIG. 1.

FIG. 2 shows the internal configuration of the amplitude control unit 11-1 in the amplitude control units 11-1 to 11-n. The amplitude control units 11-2 to 11-n have the same configuration. The amplitude control unit 11-1 comprises N-channel MOS transistors (hereinbelow, referred to as transistors) 21 and 22 connected so as to constitute a differential pair. The pair of clock signals IN1-P and IN1-N are supplied to gate terminals of the transistors 21 and 22, respectively. Lead resistors 23 and 24 are connected to drain terminals of the transistors 21 and 22, respectively. One end of each of m current source circuits connected in parallel is connected to respective source terminals of the transistors 21 and 22. The other end of each of the m current source circuits is connected to ground. Each current source circuit comprises a switch and a current source connected in series. That is, the m current source circuits include a switch 25-1 and a current source 26-1, a switch 25-2 and a current source 26-2, ..., and a switch 25-m and a current source 26-m. The digital control signals SW1-1 to SW1-m are supplied as switching control signals to contacts of the switches 25-1 to 25-m, respectively. For example, the digital control signal SW1-1 is input to the contact of the switch 25-1, namely, the digital control signal SW1-1 is turned on, thus turning on the switch 25-1. The same applies to the other switches 25-2 to 25-m. The drain terminals of the transistors 21 and 22 output the pair of amplitude-varied clock signals O1-P and O1-N. P-channel MOS transistors are also available instead of the N-channel MOS transistors.

In the above-mentioned circuitry, for the amplitude control unit 11-1, current flowing through the load resistors 21 and 22 varies in response to the ON/OFF control of the m current sources 26-1 to 26-m through the m switches 25-1 to 25-m corresponding to the digital control signals SW1-1 to SW1-m. Consequently, the amplitude of each of the pair of clock signals IN1-P and IN1-N varies into (m+1) values. The amplitude control unit 11-1 outputs the pair of clock signals O1-P and O1-N each having the varied amplitude. When all of the digital control signals SW1-1 to SW1-m are turned off, the amplitude of each of the pair of amplitude-varied clock signals O1-P and O1-N denotes zero. On the other hand, when all of the digital control signals SW1-1 to SW1-m are turned on, each of the pair of amplitude-varied clock signals O1-P and O1-N has the maximum amplitude. The same applies to the amplitude control units 11-2 to 11-n.

The operation of the whole digital control variable delay circuit will now be described by again referring to FIG. 1. Referring to FIG. 3, in the (n×m) digital control signals SW1-1 to SW1-n, ..., and SWn-1 to SWn-m to control the n amplitude control units 11-1 to 11-n, m continuous digital control signals are turned on and the other digital control signals, namely, [m×(n−1)] digital control signals are turned off. It is assumed that the digital control signals change from the above state.

In a state A, all of the digital control signals SW1-1 to SW1-m to be supplied to the first amplitude control unit 11-1 are turned on and the other digital control signals to be supplied to the other amplitude control units 11-2 to 11-n are turned off. In this case, each of the output signals (the pair of amplitude-varied clock signals O1-P and O1-N) outputted from the amplitude control unit 11-1 has the maximum amplitude. The amplitude of each of output signals (the pairs of amplitude-varied clock signals) outputted from the other amplitude control units 11-2 to 11-n indicates zero. Thus, the pair of added clock signals SIG-P and SIG-N represent the output signals (the pair of amplitude-varied clock signals O1-P and O1-N), which are output from the amplitude control unit 11-1.

In a state B, (m−1) digital control signals SW1-2 to SW1-m to be supplied to the first amplitude control unit 11-1 are turned on, the digital control signal SW2-1 to be supplied to the second amplitude control unit 11-2 is turned on, and the other digital control signals are turned off. In this case, each of the output signals (the pair of amplitude-varied clock signals O1-P and O1-N) outputted from the amplitude control unit 11-1 has the amplitude which is expressed by [the maximum amplitude×(m−1)/m]. On the other hand, each of output signals (a pair of amplitude-varied clock signals O2-P and O2-N) outputted from the amplitude control unit 11-2 has the amplitude which is expressed by (the maximum amplitude×1/m). The amplitude of each of the other output signals (pairs of amplitude-varied clock signals) outputted from the other amplitude control units 11-3 to 11-n indicates zero. Consequently, the phase of each of the pair of clock signals SIG-P and SIG-N obtained by adding the above output signals represents a phase obtained by combining the input phase of each clock signal supplied to the amplitude control unit 11-1 and that of each clock signal supplied to the amplitude control unit 11-2 in a ratio of about (m−1):1.

Similarly, in a state C, the phase of each of the pair of clock signals represents a phase obtained by combining the input phase of each clock signal supplied to the amplitude control unit 11-1 and that of each clock signal supplied to the amplitude control unit 11-2 in a ratio of (m−2):2. On the other hand, in a state D, the phases of the pair of amplitude-varied clock signals outputted from the n-th amplitude control unit 11-n and those of the pair of amplitude-varied clock signals outputted from the first amplitude control unit 11-1 are added. The phase of the amplitude control unit 11-n and that of the amplitude control unit 11-1 can be handled as continuous phases.

Control is performed so that the state changes in the order of A, B, C, D, A, ..., or the order of C, B, A, D, .... Thus, the phases of the pairs of clock signals IN-P and IN-N, ..., and INn-P and INn-N are shifted by 1/(m×n) period at substantially regular intervals, resulting in (m×n) variable delay patterns. The output signals OUT-P and OUT-N based on the (m×n) variable delay patterns can be output. Particularly, the n-th and first amplitude control units 11-n and 11-1 continuously operate, so that infinite delay can be ensured. The respective amounts of phase shift are uniquely determined in accordance with the digital control signals SW1-1 to SWn-m.

The operation will now be described in detail on condition that n=4 and m=4. In this case, (4×4=) 16 variable delay patterns can be realized for one period of an input clock signal. When n=4 and m=4, the digital control variable delay circuit has a configuration shown in FIG. 4. The pairs of clock signals IN1-P and IN1-N, ..., and IN4-P and IN4-N are shifted substantially 90 degrees (2π/4=π/2) in phase, respectively, as shown in a characteristic diagram (amplitude versus angle) of FIG. 5. In this case, (4×4) digital control signals SW1-1 to SW1-4, ..., and SW4-1 to SW4-4 change between states 1 to 5 so that four continuous digital control signals are turned on as shown in FIG. 6.

Figure 7:
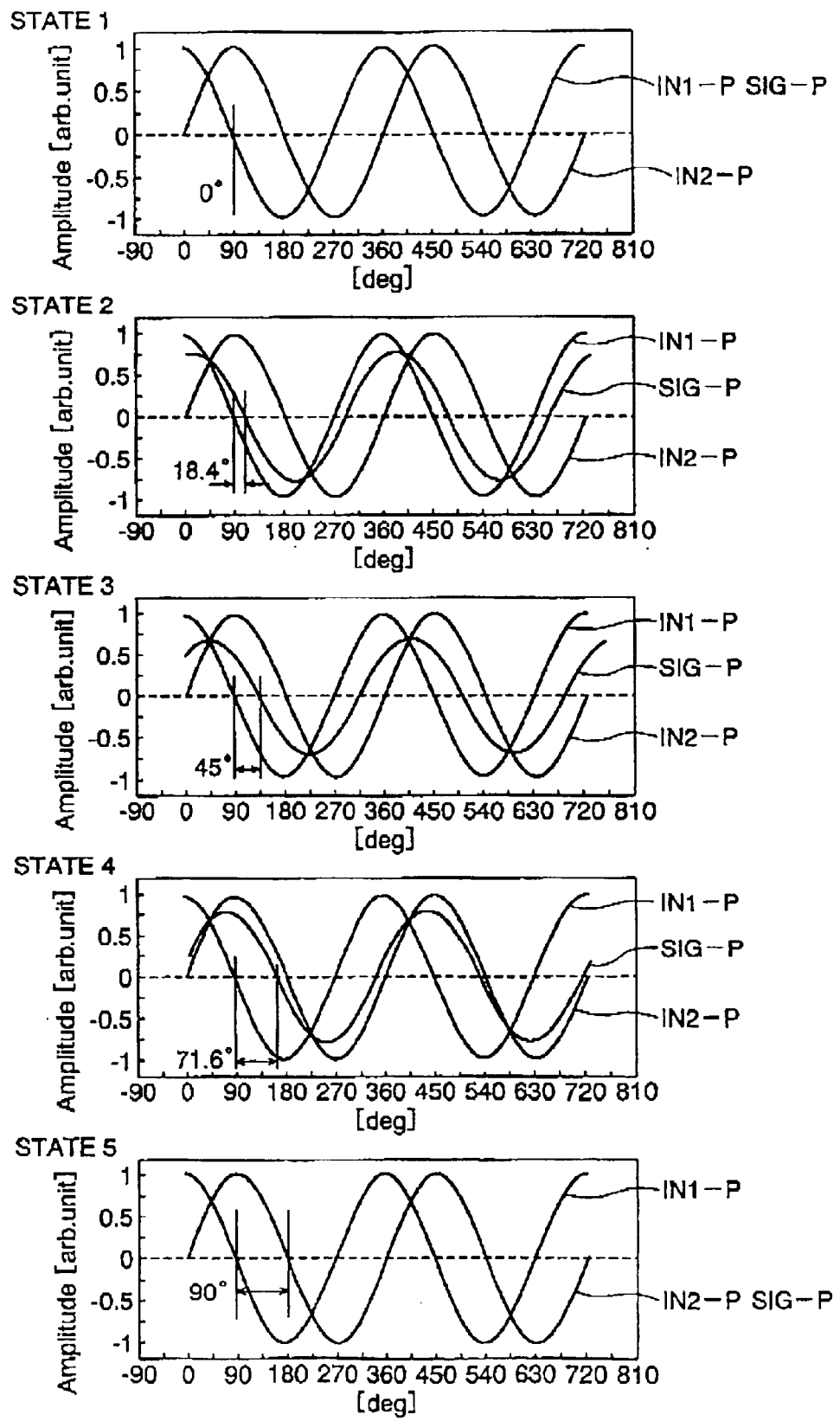
FIG. 7 shows characteristic diagrams each showing the relation between the pair of clock signals and an added clock signal obtained by adding and combining clock signals and shows states 1 to 5 of the digital control signals shown in FIG. 6.

FIG. 7 shows characteristic diagrams (amplitude versus degree) showing the relation between the input clock signals IN1-P and IN2-P and the added and combined clock signal SIG-P in the states 1 to 5 of FIG. 6.

The states 1 to 5 of FIG. 7 will be described. In the state 1, the added clock signal SIG-P fits the clock signal IN1-P.

In the state 2, the added clock signal SIG-P represents a signal expressed by the following expression (1).

$$\frac{3}{4}\cos x + \frac{1}{4}\sin x = \sqrt{\left(\frac{3}{4}\right)^2 + \left(\frac{1}{4}\right)^2} \cos(x + 18.4°)$$

$$= \sqrt{\frac{5}{8}} \cos(x + 18.4°)$$

In other words, the added clock signal SIG-P has the amount of phase shift which is substantially equivalent to an ideal angle, namely, 22.5 degrees (=90 degrees×¼).

In the state 3, the added clock signal SIG-P represents a signal expressed by the following expression (2).

$$\frac{2}{4}\cos x + \frac{2}{4}\sin x = \sqrt{\left(\frac{2}{4}\right)^2 + \left(\frac{2}{4}\right)^2} \cos(x + 45°)$$

$$= \sqrt{\frac{1}{2}} \cos(x + 45°)$$

In other words, in the state 3, the added clock signal SIG-P has the amount of phase shift which is substantially equivalent to an ideal angle, namely, 45 degrees (=90 degrees×2/4).

In the state 4, the added clock signal SIG-P indicates a signal expressed by the following expression (3).

$$\frac{1}{4}\cos x + \frac{3}{4}\sin x = \sqrt{\left(\frac{1}{4}\right)^2 + \left(\frac{3}{4}\right)^2} \cos(x + 71.6°)$$

$$= \sqrt{\frac{5}{8}} \cos(x + 71.6°)$$

In other words, in the state 4, the added clock signal SIG-P has the amount of phase shift which is substantially equivalent to an ideal angle, namely, 67.5 degrees (=90 degrees× ¾).

In the state 5, the added clock signal SIG-P fits the clock signal IN2-P.

For the above (n×m) digital control signals SW1-1 to SW1-m, ..., and SWn-1 to SWn-m, upon switching, (m+1) digital control signals are temporarily turned on. In other words, there is no case where (m−1) digital control signals are turned on. Accordingly, the decrease in current in the whole digital control variable delay circuit can be prevented. Thus, output amplitude and driving power can be stabilized.

Figure 4:
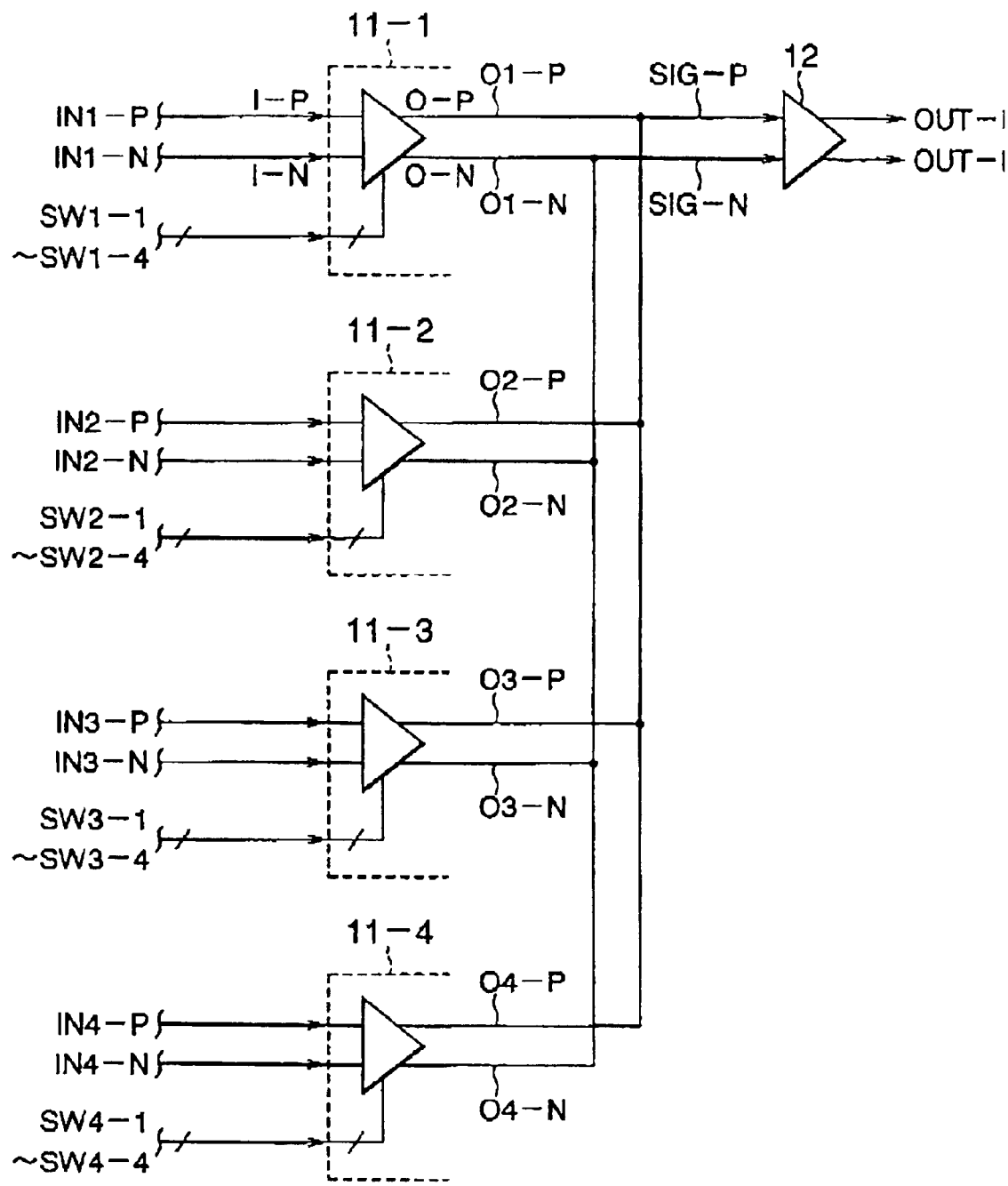
FIG. 4 is a circuit diagram showing a concrete example of the digital control variable delay circuit of FIG. 1.
Figure 5:
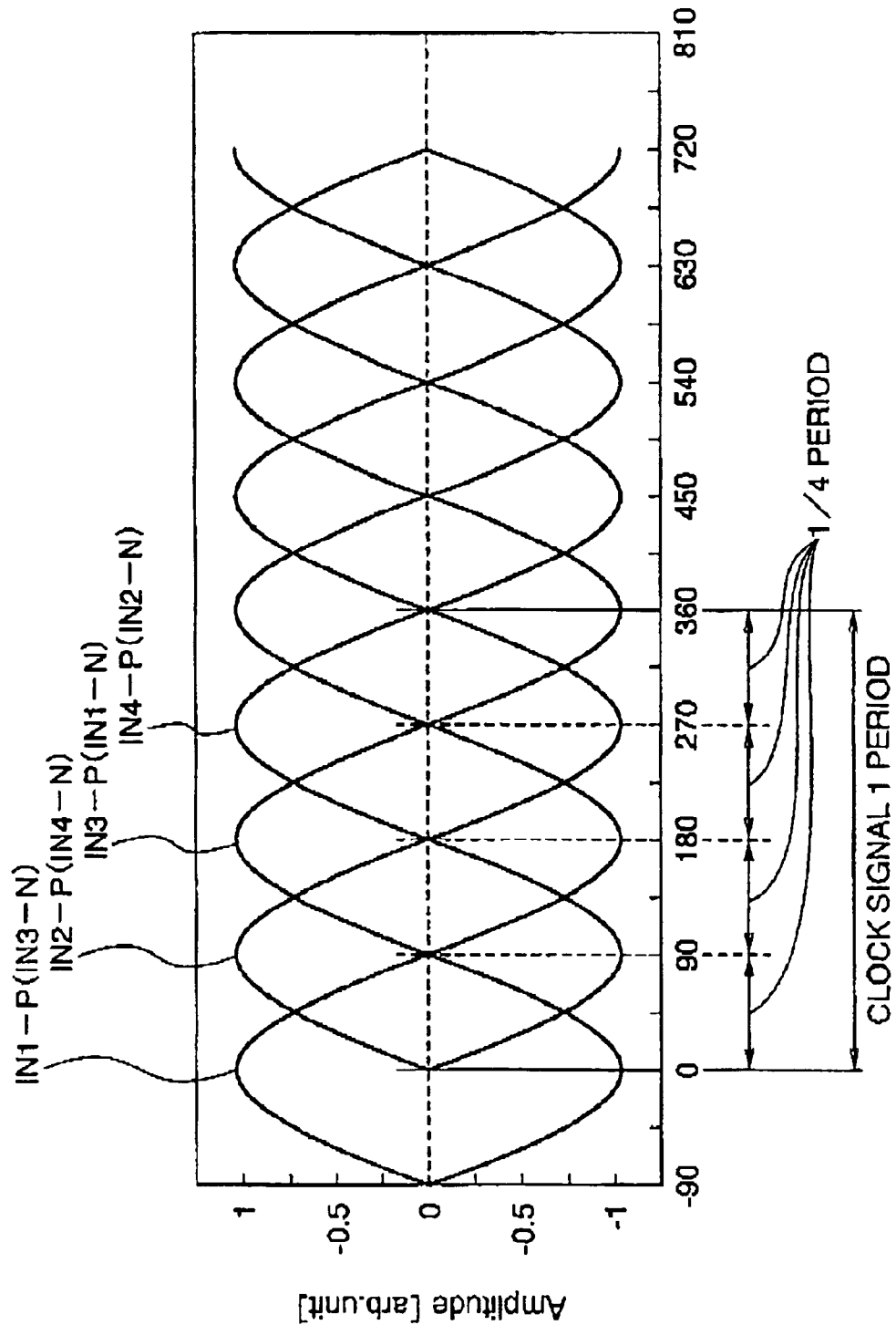
FIG. 5 is a characteristic diagram of a pair of clock signals supplied to the amplitude control units provided for the digital control variable delay circuit of FIG. 4.

FIG. 8 shows signal waveforms changed in association with the transition of the (4×4) digital control signals SW1-1 to SW1-4, ..., and SW4-1 to SW4-4 shown in FIG. 4, the signals being used to prevent the decrease in current in the digital control variable delay circuit.

In the digital control variable delay circuit in the case where n=4 and m=4, in the state 1, the four (m=4) digital control signals SW1-1 to SW1-4 are turned on. Subsequently, the above digital control signals SW1-1 to SW1-4 and the digital control signal SW2-1, namely, the total five (m+1=5) digital control signals are turned on at specific timing upon switching between the states 1 and 2. After that, the four (m=4) digital control signals SW1-2 to SW1-4 and SW2-1 are turned on in the state 2 after switching. Further, the above four digital control signals SW1-2 to SW2-1 and the digital control signal SW2-2 namely, the total five (m+1=5) digital control signals are turned on at specific timing upon switching between the states 2 and 3. Subsequently, in the state 3, the four (m=4) digital control signals SW1-3, SW1-4, SW2-1, and SW2-2 are turned on.

Figure 9:
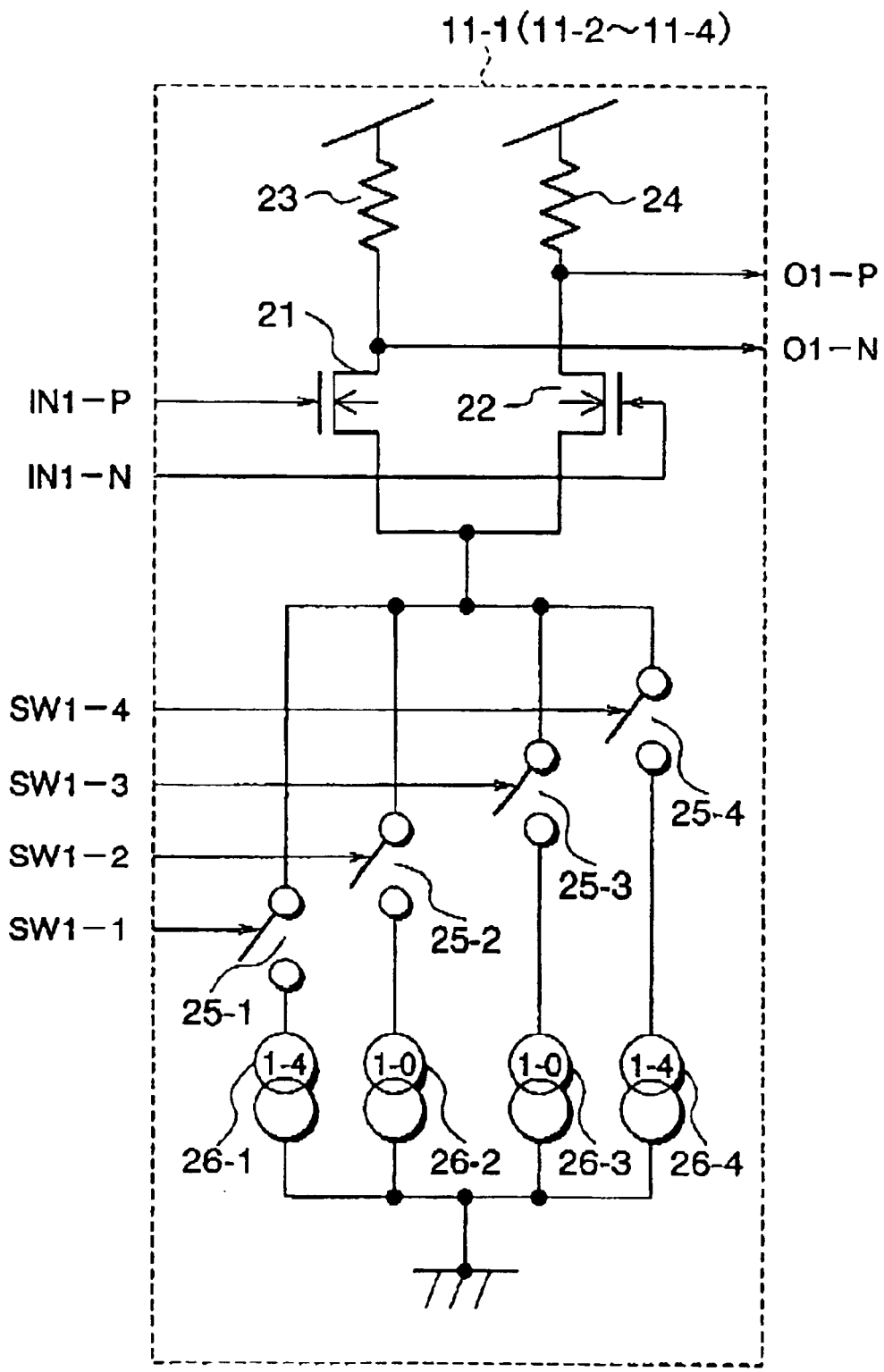
FIG. 9 is a circuit diagram of the configuration of each amplitude control unit for realizing the transition of the states shown in FIG. 8.

FIG. 9 is a circuit diagram of the amplitude control unit for realizing the transition of the states of the digital control signals shown in FIG. 8.

Regarding the amplitude control unit 11-1 in the amplitude control units 11-1 to 11-4, the circuitry shown in FIG. 8 corresponds to that of FIG. 2 on condition that n=4 and m=4. To realize the transition of the states as described in FIG. 8, the amounts of current I26-1, I26-2, I26-3, and I26-4 of the current sources 26-1, 26-2, 26-3 and 26-4 can be set in a ratio of, for example, 1.4:1.0:1.0:1.4 so as not to cause delay variations after phase interpolation.

As thus far been described above, according to the present invention, it is possible to provide a digital control variable delay circuit with simple circuitry which is hardly susceptible to influences caused by external noise and which delays a signal by the amount of delay uniquely corresponding to a control signal to ensure arbitrary infinite delay of one period or longer.

What is claimed is:

1. A digital control variable delay circuit comprising:

n amplitude control units which are connected in parallel and each of which receives a pair of input clock signals to be supplied to a differential pair and receives m-bit digital control signals, n and m each indicating a natural number of 2 or larger; and waveform shaping unit which is shared between the n amplitude control units and is connected, in common, to the outputs of the n amplitude control units, wherein the respective pairs of clock signals supplied to the n amplitude control units are shifted in phase by about 1/n period, each amplitude control unit being capable of varying the amplitude of each of the pair of clock signals into (m+1) values using the m-bit digital control signals, and outputting a pair of amplitude-varied clock signals, the waveform shaping unit receiving a pair of added clock signals obtained by adding and combining the pairs of amplitude-varied clock signals outputted from the n amplitude control units, shaping the waveform of each of the pair of added clock signals, and then outputting a pair of resultant clock signals as output signals.

2. The digital control variable delay circuit according to claim 1, wherein each amplitude control unit comprises a pair of MOS transistors sharing a common terminal and constituting a differential pair, m current source circuits connected in parallel, and a pair of load resistors connected to respective output terminals of the pair of MOS transistors, the m current source circuits each comprising a current source and a switching unit, each current source and the corresponding switching unit being connected in series, each of the switching units being turned on or off by the corresponding one of the m-bit digital control signals, one end of each of the m current source circuits connected in parallel being connected to ground and the other end thereof being connected to the common terminal of the pair of MOS transistors, the output terminals of the pair of MOS transistors outputting the pair of amplitude-varied clock signals.

3. The digital control variable delay circuit according to claim 2, wherein in each of the n amplitude control units, the m switching units are turned on and off in response to the respective m-bit digital control signals to vary the number of current sources connected to the pair of MOS transistors so as to change current flowing through the pair of load resistors, thus varying the amplitude of each of the pair of clock signals into (m+1) values.

4. The digital control variable delay circuit according to claim 3, wherein in each of the n amplitude control units, when all of the m-bit digital control signals are turned off, the amplitude of each of the pair of amplitude-varied clock signals indicates zero.

5. The digital control variable delay circuit according to claim 3, wherein in each of the n amplitude control units, when one or more of the m-bit digital control signals are turned on, the amplitude of each of the pair of amplitude-varied clock signals lies in a range of (the maximum value×1/m) to (the maximum value×m/m).

6. The digital control variable delay circuit according to claim 5, wherein in each of the n amplitude control units, when all of the m-bit digital control signals are turned on, each of the pair of amplitude-varied clock signals has the maximum amplitude.

7. The digital control variable delay circuit according to claim 2, wherein in each of the n amplitude control units, the size ratio in the m current sources is set so as to generate no delay variations after phase interpolation in the whole digital control variable delay circuit and is set so that (m+1) digital control signals of (n×m) digital control signals are temporarily turned on in the whole digital control variable delay circuit.

8. The digital control variable delay circuit according to claim 7, wherein the size ratio in the m current sources is set on the basis of the current ratio in the m current sources.

* * * * *